US011321608B2

(12) United States Patent
Yasuda et al.

(10) Patent No.: US 11,321,608 B2
(45) Date of Patent: May 3, 2022

(54) SYNAPSE MEMORY CELL DRIVER

(71) Applicant: INTERNATIONAL BUSINESS MACHINES CORPORATION, Armonk, NY (US)

(72) Inventors: Takeo Yasuda, Nara (JP); Masatoshi Ishii, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 1142 days.

(21) Appl. No.: 15/875,420

(22) Filed: Jan. 19, 2018

(65) Prior Publication Data

US 2019/0228295 A1  Jul. 25, 2019

(51) Int. Cl.

| | |
|---|---|
| *G06N 3/063* | (2006.01) |
| *G06N 3/04* | (2006.01) |
| *G11C 15/04* | (2006.01) |
| *G06N 3/08* | (2006.01) |
| *G06N 3/10* | (2006.01) |
| *G11C 13/00* | (2006.01) |
| *G06N 3/00* | (2006.01) |
| *G11C 8/16* | (2006.01) |
| *G11C 11/56* | (2006.01) |
| *G11C 11/54* | (2006.01) |

(52) U.S. Cl.
CPC .............. *G06N 3/0635* (2013.01); *G06N 3/00* (2013.01); *G06N 3/049* (2013.01); *G06N 3/08* (2013.01); *G06N 3/10* (2013.01); *G11C 8/16* (2013.01); *G11C 11/54* (2013.01); *G11C 11/56* (2013.01); *G11C 13/004* (2013.01); *G11C 13/0023* (2013.01); *G11C 13/0061* (2013.01);
(Continued)

(58) Field of Classification Search
CPC ........ G06N 3/0635; G06N 3/00; G06N 3/049; G06N 3/08; G06N 3/10; G11C 8/16; G11C 11/54; G11C 11/56; G11C 13/0023; G11C 13/004; G11C 13/0061; G11C 13/0069; G11C 15/046; G11C 2013/0088
See application file for complete search history.

(56) References Cited

U.S. PATENT DOCUMENTS

| | | |
|---|---|---|
| RE41,658 E | 9/2010 | Fabbrizio et al. |
| 9,111,222 B2 | 8/2015 | Aparin |
(Continued)

OTHER PUBLICATIONS

Hasan, R., & Taha, T. M. (Jul. 2014). Enabling back propagation training of memristor crossbar neuromorphic processors. In 2014 International Joint Conference on Neural Networks (IJCNN) (pp. 21-28). IEEE. (Year: 2014).*
(Continued)

*Primary Examiner* — Kamran Afshar
*Assistant Examiner* — Lokesha G Patel
(74) *Attorney, Agent, or Firm* — Tutunjian & Bitetto, P.C.; Randall Bluestone

(57) ABSTRACT

A synapse memory system includes: synapse memory cells provided at cross points of axon lines and dendrite lines, each synapse memory cell being associated with nonvolatile random-access memory (NVRAM), each synapse memory cell being configured to store a weight value according to an output level of a write signal; a write portion configured to write the weight value to each synapse memory cell, the write portion including a write driver and an output controller, the write driver being a digital driver configured to output the write signal to a subject synapse memory cell, the output controller being configured to control the output level of the write signal of the write driver; and read drivers configured to read the weight value stored in the synapse memory cells.

16 Claims, 9 Drawing Sheets

(52) U.S. Cl.
CPC ........ *G11C 13/0069* (2013.01); *G11C 15/046* (2013.01); *G11C 2013/0088* (2013.01)

(56) References Cited

U.S. PATENT DOCUMENTS

| | | |
|---|---|---|
| 2014/0355381 A1 | 12/2014 | Lal et al. |
| 2016/0364643 A1 | 12/2016 | Cruz-Albrecht et al. |
| 2017/0063351 A1 | 3/2017 | Kurokawa |

OTHER PUBLICATIONS

Li, F., Zhang, B., & Liu, B. (2016). Ternary weight networks. arXiv preprint arXiv:1605.04711,.pp. 2. (Year: 2016).*

Eryilmaz, "Device and System Level Design Considerations for Analog-Non-Volatile-Memory Based Neuromorphic Architectures", IEDM'15 Technical Digest, Dec. 2015, pp. 1-6.

Schemmel, "A Mixed-Mode Analog Neural Network Using Current-Steering Synapses", Analog Integrated Curcuits and Signal Processing, Feb. 2004, vol. 28, Issue 2, pp. 233-244.

Merolla, "A Digital Neurosynaptic Core Using Embedded Crossbar Memory with 45pJ per Spike in 45nm", 2011 IEEE Custom Integrated Circuits Conference, Sep. 2011, pp. 1-4.

Moradi, "An Event-Based Neural Network Architecture With an Asynchronous Programmable Synaptic Memory", IEEE Transactions on Biomedical Circuits and Systems, vol. 8, No. 1, Feb. 2014, pp. 98-107.

Wu, "Recent Progress of Resistive Switching Random Access Memory (RRAM)" Silicon Nanoelectronics Workshop (SNW), 2012 IEEE, Jun. 2012, pp. 1-4.

* cited by examiner

SYNAPSE MEMORY CELL DRIVER

BACKGROUND

Technical Field

The present invention relates to a synapse memory cell driver.

Description of the Related Art

Recently, various techniques have been known regarding a synapse memory cell driver.

SUMMARY

According to an embodiment of the present invention, there is provided a synapse memory system. The synapse memory system includes plural synapse memory cells, a write portion, and plural read drivers. The plural synapse memory cells are provided at cross points of plural axon lines and plural dendrite lines. Each synapse memory cell is associated with nonvolatile random-access memory (NVRAM). Each synapse memory cell is configured to store a weight value according to an output level of a write signal. The weight value to be stored in each synapse memory cell is one value of at least three different values. The write portion is configured to write the weight value to each synapse memory cell. The write portion includes a write driver and an output controller. The write driver is a digital driver configured to output the write signal to a subject synapse memory cell. The subject synapse memory cell is one of the synapse memory cells. The subject synapse memory cell is selected to store the weight value. The output controller is configured to control the output level of the write signal of the write driver. The read drivers are configured to read the weight value stored in the synapse memory cells.

According to another embodiment of the present invention, there is provided a device including a synapse memory system. The synapse memory system includes plural synapse memory cells, a write portion, and read drivers. The plural synapse memory cells are provided at cross points of plural axon lines and plural dendrite lines. Each synapse memory cell is associated with nonvolatile random-access memory (NVRAM). Each synapse memory cell is configured to store a weight value according to an output level of a write signal. The weight value to be stored in each synapse memory cell is one value of at least three different values. The write portion is configured to write the weight value to each synapse memory cell. The write portion includes a write driver and an output controller. The write driver is a digital driver configured to output the write signal to a subject synapse memory cell. The subject synapse memory cell is one of the synapse memory cells. The subject synapse memory cell is selected to store the weight value. The output controller is configured to control the output level of the write signal of the write driver. The read driver is configured to read the weight value stored in the synapse memory cells.

DETAILED DESCRIPTION

Hereinafter, exemplary embodiments of the present invention will be described in detail with reference to the attached drawings.

It is to be noted that the present invention is not limited to these exemplary embodiments to be given below and may be implemented with various modifications within the scope of the present invention. In addition, the drawings used herein are for purposes of illustration, and may not show actual dimensions.

Figure 1:
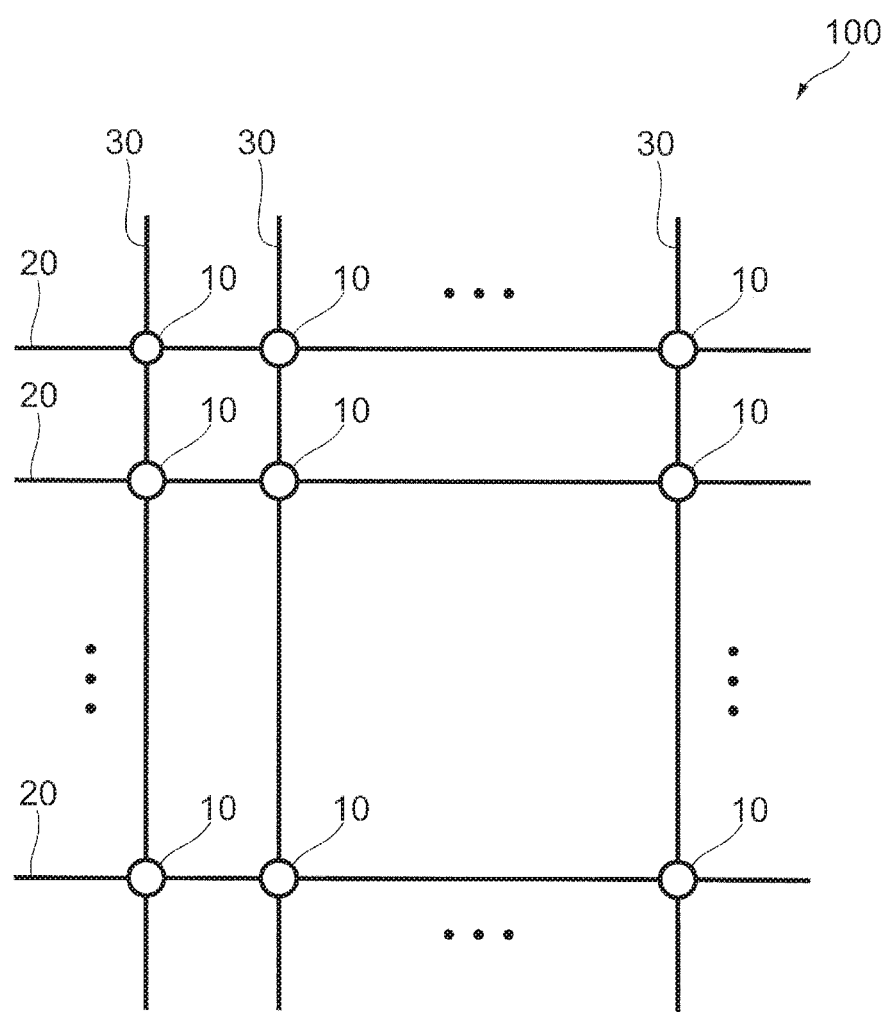
FIG. 1 depicts a synapse memory having a cross-bar array according to an embodiment of the present invention.

FIG. 1 depicts a synapse memory 100 having a cross-bar array according to an exemplary embodiment of the present invention.

Hardware implementation of a neuro-synaptic core system may include synapse memories as well as neuron bodies and axon connection networks. As shown in FIG. 1, the cross-bar array of the synapse memory 100 may include synapse memory cells 10 arranged/placed at cross points of axons 20 and dendrites 30. Each of the synapse memory cells 10 may store a synapse weight value, which indicates a weight of synapse connection of the corresponding synapse memory cell 10. Note that the axons 20 can correspond to respective axons of pre-neurons and the dendrites 30 correspond to respective dendrites of post-neurons.

In the present exemplary embodiment, the synapse memory cell 10 may be associated with nonvolatile random-access memory (NVRAM), such as a flash memory, a ferroelectric random-access memory (FeRAM), a magnetoresistive random-access memory (MRAM), a phase change random-access memory (PRAM), and a resistive random-access memory (ReRAM).

Writing data to the NVRAM is executed by applying a voltage or a current to the NVRAM. The NVRAM can store the data using a state change of a corresponding synapse memory cell 10, in response to the applied voltage or current. Note that the state change used for recording data depends on structure of the NVRAM. For example, the state change may include at least one of a change in an electrical state, a change in a magnetic state, and a change in phase state.

The extent of the state change may vary depending on magnitude of the applied voltage or current, e.g., a voltage value or a current value. This enables the NVRAM to store a continuous value (e.g., analog value) or a multi-value (e.g., discrete value). Note that the NVRAM can store and hold a value being one of at least three different (not digital) values. In other words, the NVRAM can be used as an analog memory. In the example shown in FIG. 1, the synapse memory cell 10 is constituted by the NVRAM, so that controlling the voltage value or the current value to be applied to the NVRAM enables control of the synapse weight value stored in the synapse memory cell 10. For example, if the voltage value is used to control a write operation on the NVRAM, a larger voltage value allows the NVRAM to store a larger synapse weight value. This tuning of the voltage/current can be done after manufacturing of a synapse memory cell system, which will be described in further detail herein below. Note that the choice of whether to use the voltage value or the current value to control the write operation on the NVRAM can be determined based on a characteristic of the NVRAM, such as a type of change in the state used for data recording, and variation width, speed, or precision of the state change that varies depending on the voltage value or the current value.

Here, the NVRAM can support additional recording and continuous value recording, so that the NVRAM is suited for the implementation of synapses in a real-time learning operation. Note that a complex write circuit can be needed to use the NVRAM for an analog memory. Further, the value stored in the NVRAM can change depending on variations in, for example, a process, temperature and/or supply voltage. In the present exemplary embodiment, a hybrid access scheme (e.g., digital-write and analog-read operation) can be adapted for low-power and high-speed operation to avoid the effect of such variations.

Figure 2:
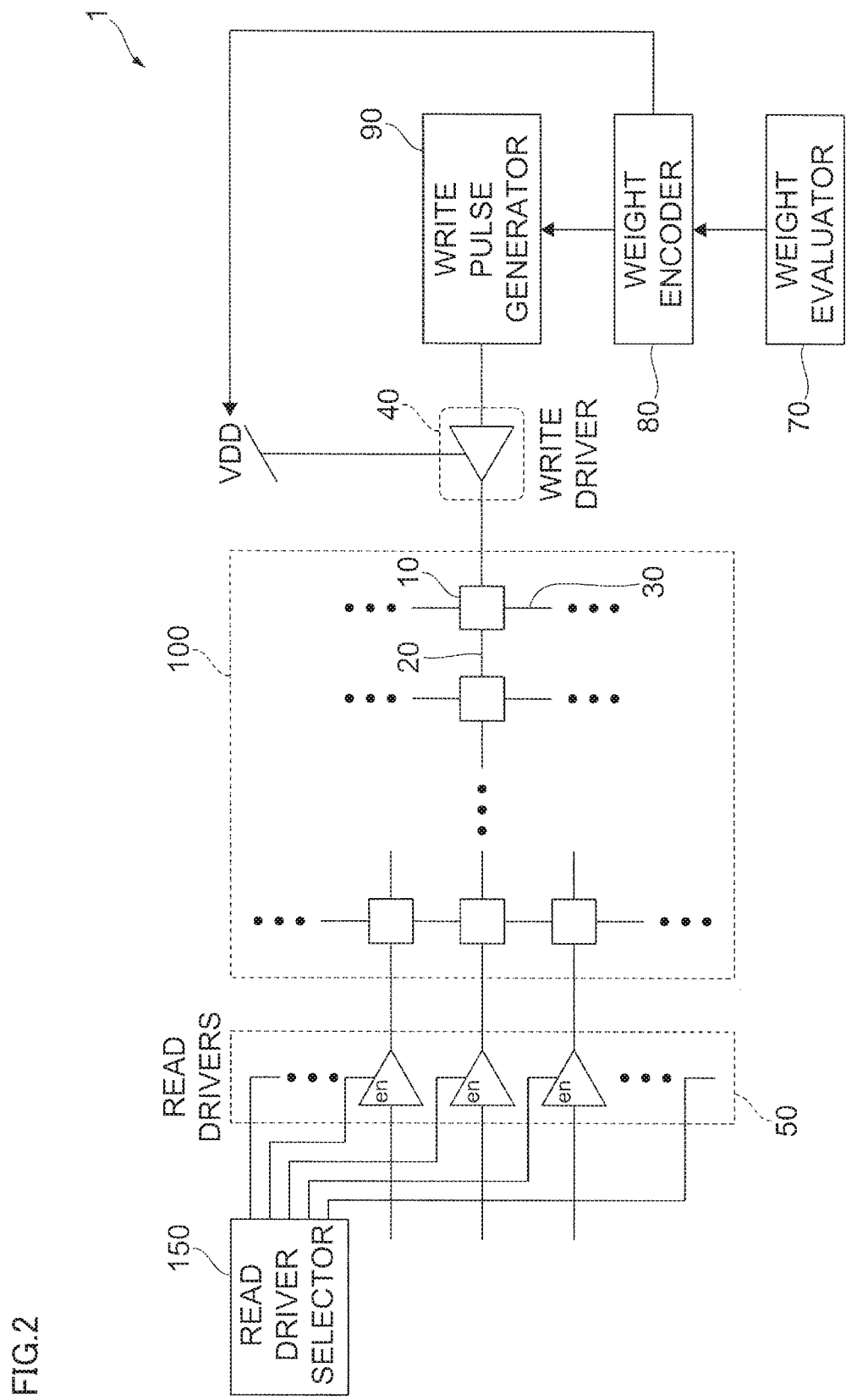
FIG. 2 depicts a synapse memory cell system according to an embodiment of the present invention.

FIG. 2 depicts a synapse memory cell system 1 according to the exemplary embodiment.

As shown in FIG. 2, the synapse memory cell system 1 may include a synapse memory 100, a write driver 40, read drivers 50, a read driver selector 150, a weight evaluator 70, a weight encoder 80, and a write pulse generator 90. Note that the synapse memory cell system 1 can be a neuromorphic system on silicon.

As described above with reference to FIG. 1, the synapse memory 100 has a cross-bar array of the axons 20 and the dendrites 30, and includes synapse memory cells 10 arranged at cross points of the axons 20 and the dendrites 30. This exemplary embodiment assumes that writing the synapse weight value to the NVRAM is executed by controlling the voltage value. However, in other embodiments, the writing of the synapse weight value to the NVRAM can be executed by controlling the current value.

The write driver (synapse memory cell driver) 40 is connected to the synapse memory 100. The write driver 40 may be configured to write the synapse weight value to respective ones of the synapse memory cells 10 in response to a learning operation input or a recognition operation input. For example, the write driver 40 may apply a voltage to respective ones of the axons 20.

The dendrites 30 are connected to a dendrite driver (not shown) that selects, from the dendrites 30, one or more subject dendrites with which the synapse weight value is written in a write operation or read in a read operation. The dendrite driver may selectively apply the voltage to the dendrites 30 to enable the dendrite driver to select the one or more subject dendrites. For example, in the write operation to write the synapse weight value, the dendrite driver can set one of the dendrites 30 to a ground (GND) state and can the other ones of the dendrites 30 to a high impedance (Hi-Z) state. The write driver 40 can then select an axon 20 to apply the voltage thereto. This results in the synapse weight value being written in the synapse memory cell 10 on the cross point of the dendrite 30 set to the GND state and the selected axon 20 applied with the voltage by the write driver 40. The write driver 40 receives a pulse signal for controlling an output timing. A supply or driving voltage (VDD) is applied to the write driver 40. Note that the write driver 40 is configured to control the voltage applied to the synapse memory cells 10.

The read drivers 50 are connected to the synapse memory 100. The read drivers 50 may be configured to read the synapse weight value from the synapse memory cells 10 in response to receiving a recognition operation input. For example, the dendrite driver (not shown) can set one or more of the dendrites 30 with which the synapse weight value is read to the GND state, and set the other ones of the dendrites 30 to the Hi-Z state. The read driver selector 150 can select or enable the read drivers 50 to apply a voltage to an axon 20. This results in the synapse weight value being read from the synapse memory cell 10 on the cross point of the dendrite 30 set to the GND state and the selected axon 20 applied with the voltage by the read drivers 50. In the read operation of the synapse weight value, a total synapse weight value is read for each dendrite 30 set to the GND state. The total synapse weight value can be defined as a sum of the synapse weight values of the respective synapse memory cells 10 which are on the selected axon 20 being applied with the voltage.

The weight evaluator 70 may evaluate a current synapse weight value with a neuron output signal from the dendrites 30, and determine the next synapse weight value. For example, the weight evaluator 70 can compare the neuron output signal obtained from the dendrites 30 with a desired output signal given as a learning operation input, and calculate the next synapse weight value with which the current synapse weight value stored in the synapse memory cell 10 is to be updated.

The weight encoder 80 may encode the next synapse weight value calculated by the weight evaluator 70. For example, the weight encoder 80 can encode the next synapse weight value into binary encoded values. The weight encoder 80 can control the driving voltage of the write driver 40 based on the next synapse weight value calculated by the weight evaluator 70. This enables the write driver 40 to control the voltage applied to the synapse memory cells 10. Examples of controlling the driving voltage of the write driver 40 will be described herein below.

The write pulse generator 90 may conduct a modulation process, such as pulse width modulation and/or pulse number (or frequency) modulation. In other words, the write pulse generator 90 may generate and output a pulse signal based on the encoded value generated by the weight encoder 80. This pulse signal and the driving voltage controlled by the weight encoder 80 lead the write driver 40 to update the current synapse weight value stored in the synapse memory cell 10.

In the present exemplary embodiment, the write driver 40 may be a digital driver outputting a write signal (e.g., outputting a "0" signal or a "1" signal) based on the pulse signal generated by the write pulse generator 90. Note that an output value, e.g., the voltage value of the output signal, is controlled by the VDD applied to the write driver 40. Different values of VDD applied to the write driver 40 cause different output values. Accordingly, the value to be stored in the synapse memory cell 10 can vary depending on the VDD applied to the write driver 40.

Several methods can be used to update the current synapse weight value, such as (i) a method for adding a gap between the current synapse weight value and the next synapse weight value to the current synapse weight value, and (ii) a method for setting the current synapse weight to "0", thus writing the next synapse weight value.

For example, the method (i) can be used to decrease a synapse weight value by applying a voltage having opposite polarity to a voltage applied for increasing the synapse weight value, with the amount of the decrease of the synapse weight value being controlled by a value of the VDD.

In the method (i), several levels as to the output value of the write driver 40 can be set for controlling the synapse weight value. For example, the levels can include "driver common level," "set threshold level," and "reset threshold level." The driver common level is a voltage level when the write driver 40 is in an off state (inactive). In the example shown in FIG. 2, the synapse memory cell 10 is configured to keep the current weight value if the output value of the write driver 40 is between the set threshold level and the reset threshold level or in the Hi-Z state and the voltage value applied to the dendrites 30 is at the driver common level. The set threshold level, e.g., a positive threshold level, is a voltage level at or over which the write operation to increase the synapse weight value is executable. The reset threshold level, e.g., a negative threshold level, is a voltage level at or under which the write operation to decrease the synapse weight value is executable. The output value of the write driver 40 is an example of the claimed output level.

When the write driver 40 is in the off state, the applied voltage to the synapse memory cell 10 is between the set threshold level and the reset threshold level or high impedance state and the synapse memory cell 10 keeps the current weight value. This prevents the write operation of the synapse weight value.

When the write driver 40 outputs the "1" signal, the applied voltage shifts from the driver common level to the set threshold level or over. When the write driver 40 outputs the "0" signal, the applied voltage shifts from the driver common level to the reset threshold level or under.

When the voltage applied by the write driver 40 exceeds the set threshold level, the synapse weight value is increased. An amount of the increase depends on an amount by which the voltage applied by the write driver 40 exceeds the set threshold level. Accordingly, controlling how much the voltage exceeds the set threshold level by adjusting the voltage applied by the write driver 40 enables control of the amount of increase of the synapse weight value.

When the voltage applied by the write driver 40 falls below the reset threshold level, the synapse weight value is decreased. An amount of the decrease depends on an amount by which the voltage applied by the write driver 40 falls below the reset threshold level. Accordingly, controlling how much the voltage falls below the reset threshold level by adjusting the voltage applied by the write driver 40 enables control of the amount of decrease of the synapse weight value.

Note that if the applied voltage is between the set threshold level and the reset threshold level, the synapse weight value is maintained. In other words, the write operation on the synapse memory cell 10 is not conducted. The read drivers 50 read the synapse weight value from the synapse memory cells 10 by applying the voltage in this range to the synapse memory cells 10.

The choice of the method for updating the current synapse weight value depends on the characteristic of the NVRAM, such as a type of change in the state used for recording data. Note that the different methods may be used to increase the synapse weight value and decrease the synapse weight value.

The process of updating synapse weights to be stored in the synapse memory cells 10 of the synapse memory 100 may be referred to as learning. The learning may include online learning and offline learning. In online learning, when the synapse memory 100 receives a set of data (or a part of all data), the weight of the synapse memory cell 10 receiving the set of data is updated using the received set of data. In offline learning, the weight of the respective synapse memory cells 10 is set based on data prepared in advance. Accordingly, the offline learning is not performed with a set of data which the synapse memory 100 receives, but is performed as a software simulation (e.g., without the hardware including the synapse memory 100).

As mentioned above, the write driver 40 drives the synapse memory cells 10 in a digital manner (high or low). This enables the write driver 40 to perform a write operation at high speed. Further, in the example shown in FIG. 2, pulse height, width and number modulations, which are used for multi-level cell (MLC) write operations in flash memory, are not required. Here, the example of the digital write shown in FIG. 2 may avoid an increase in the area where the synapse memory cells are provided. Further, the example may avoid influence on fast analog read operations.

Figure 3:
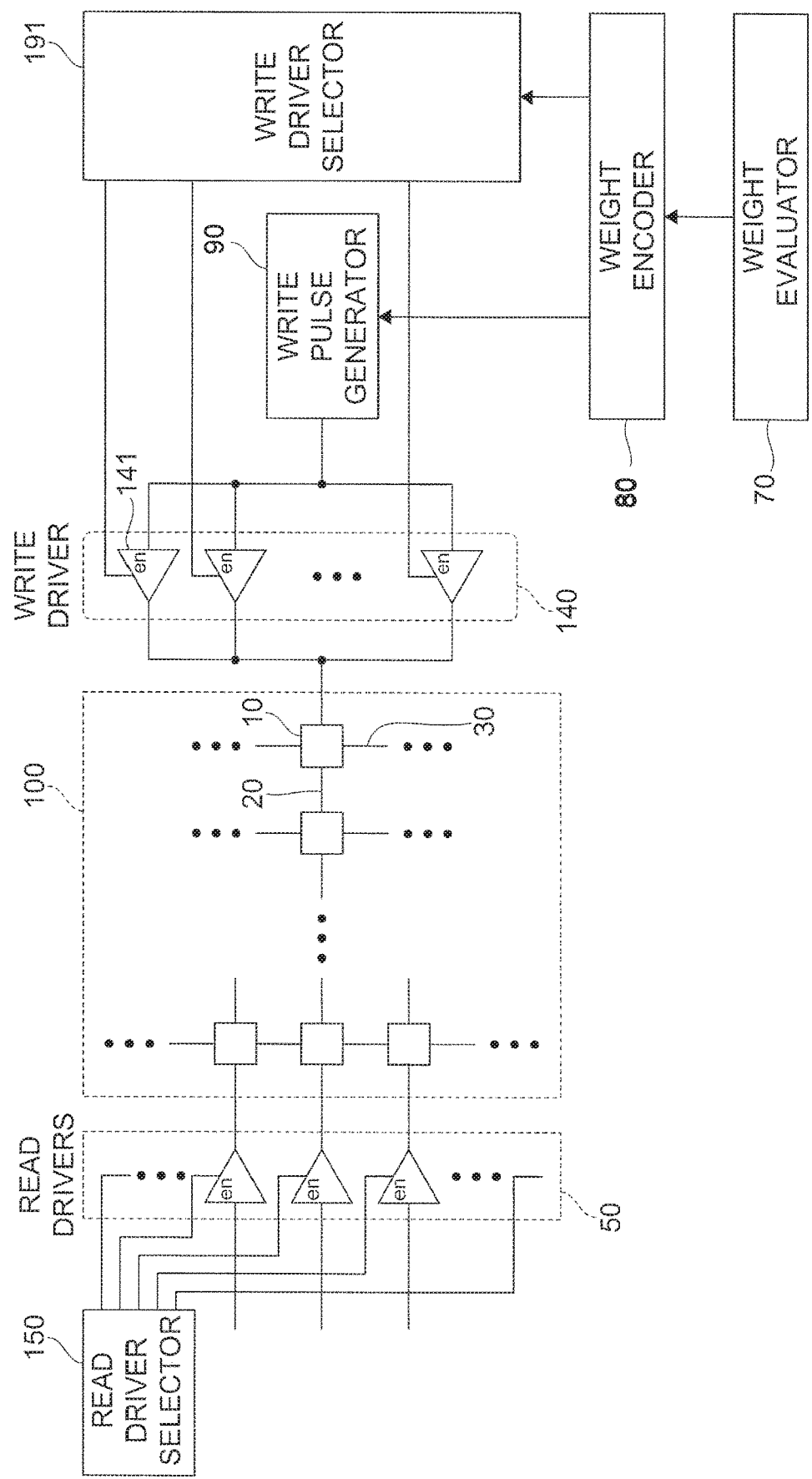
FIG. 3 depicts a synapse memory cell system according to an embodiment of the present invention.

FIG. 3 depicts an example of a synapse memory cell system 101 according to an exemplary embodiment. In FIG. 3, the same structures as those explained with reference to FIG. 2 are denoted by the same reference numerals, and the detailed explanation thereof will be omitted.

The synapse memory cell system 101 may include a write driver structure and surrounding circuits thereof to control the driving voltage of a write driver 140. For example, as shown in FIG. 3, the synapse memory cell system 101 includes the write driver 140 and a write driver selector 191. The write driver 140 includes multiple write driver bodies 141 provided in parallel. The write driver bodies 141 are digital drivers that can output a "0" or "1" signal. The output values, e.g., voltage values, of the respective write driver bodies 141 are different from each other. The write driver selector 191 selects and activates one of the write driver bodies 141. For example, the write driver selector 191 can select and activate one of the write driver bodies 141 under control of the weight encoder 80. By selecting one of the write driver bodies 141 to be activated by the write driver selector 191, the applied voltage to the synapse memory cell 10, e.g., the output voltage of the selected write driver body 141, can be controlled. This allows the synapse memory cell 10 to store the synapse weight value at a desired value.

Although FIG. 3 shows only one pair of the write driver 140 and the write driver selector 191, multiple pairs are provided on the respective axons 20. That is to say, the number of the pairs matches the number of the axons 20. This enables the write driver 140 to apply an independently controlled voltage to every axon 20. The write driver selector 191 is an example of the claimed output controller.

Figure 4:
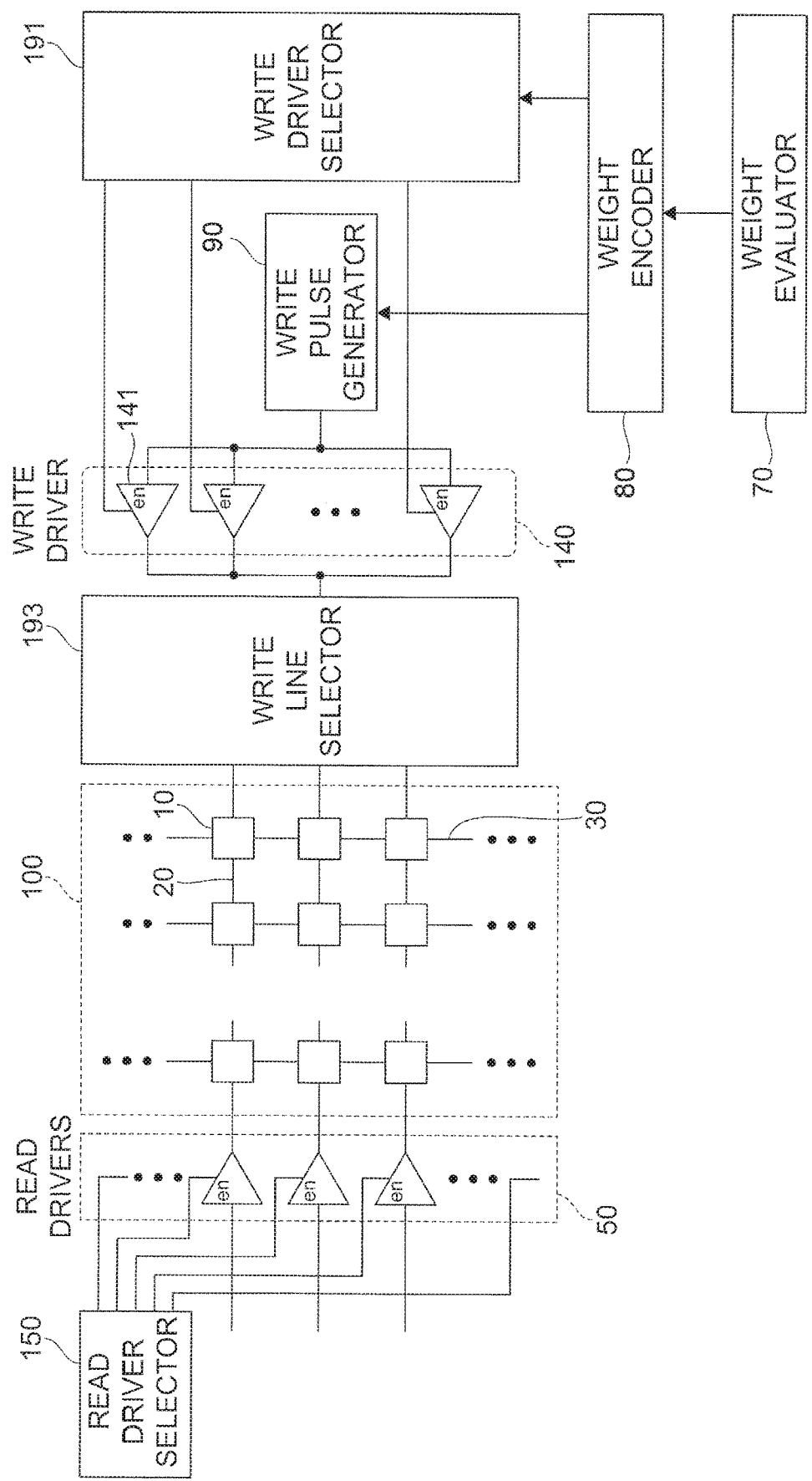
FIG. 4 depicts a synapse memory cell system according to an embodiment of the present invention.

FIG. 4 depicts an example of a synapse memory cell system 201 according to an exemplary embodiment. In FIG. 4, the same structures as those explained with reference to FIGS. 2 and 3 are denoted by the same reference numerals, and the detailed explanation thereof will be omitted.

As shown in FIG. 4, the synapse memory cell system 201 may include the write driver 140, the write driver selector 191, and a write line selector 193. This enables the weight encoder 80 to control the driving voltage of the write driver 140. The write driver 140 including the write driver bodies 141 and the write driver selector 191 are the same as those of the first example shown in FIG. 3. However, the number of the pair(s) of the write driver 140 and the write driver selector 191 is less than the number of the axons 20. In FIG. 4, a single writer driver/write driver selector pair is depicted, although such an embodiment is not limiting. The write line selector 193 selects one or more axons 20 (e.g., one by one) to which the write driver 140 applies the voltage. For example, the write line selector 193 can switch the selected axons 20 in a predetermined order at a certain switch timing. In this example, the weight encoder 80 can control the write driver 140 and the write driver selector 191 to apply the voltage to the synapse memory cell(s) 10 provided on the selected axon(s) 20 according to the switching timing. This enables the write driver 140 and the write driver selector 191 to write the synapse weight value to the synapse memory cells 10 provided on the respective axons 20. Note that this differs from the illustrative example depicted in FIG. 3.

Figure 5:
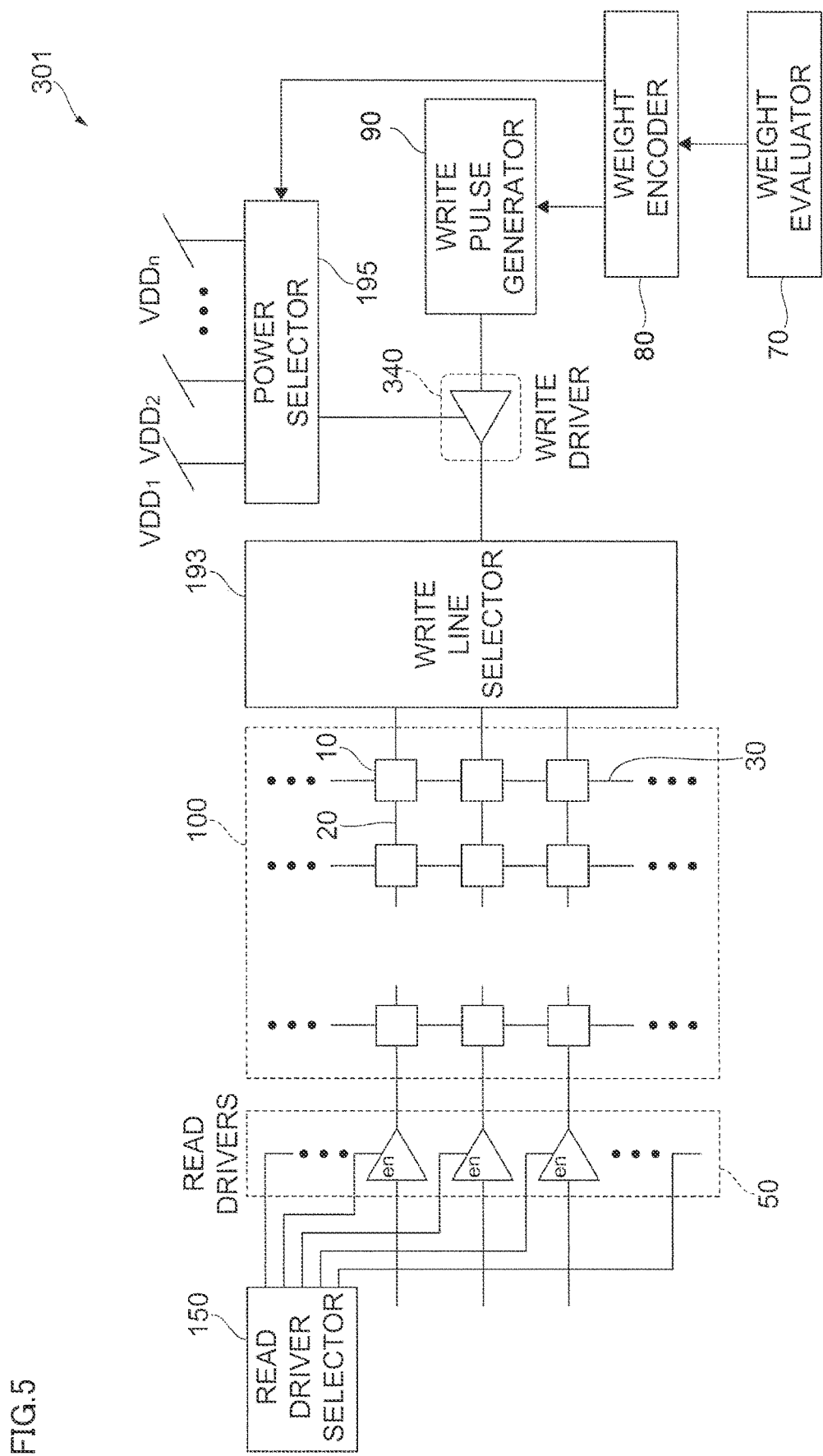
FIG. 5 depicts a synapse memory cell system according to an embodiment of the present invention.

FIG. 5 depicts an example of a synapse memory cell system 301 according to an exemplary embodiment. In FIG. 5, the same structures as those explained with reference to FIGS. 2 and 4 are denoted by the same reference numerals, and the detailed explanation thereof will be omitted.

As shown in FIG. 5. the synapse memory cell system 301 may include the write driver 40, the write line selector 193, and a power selector 195 controlling the VDD supplied to the write driver 40. This enables the weight encoder 80 to control the driving voltage of the write driver 40. The write driver 40 applies the voltage to the respective axons 20 according to the VDD supplied by the power selector 195. For example, the power selector 195 can be connected to multiple power sources (VDD to VDD~) having different voltage values from each other. The power selector 1 selects one of the multiple power sources VDD to VDDI to apply the voltage to the write driver 40 under control of the weight encoder 80. By changing the VDD supplied to the write driver 40, the output voltage of the write driver 40 can be controlled. This allows the synapse memory cell 10 to store the synapse weight value at a desired value.

Although the illustrative system depicted in FIG. 5 is shown utilizing the write line selector 193 to switch the axons 20, similar to the illustrative system depicted in FIG. 4, a set of the write driver 40 and the power selector 195 can be provided on every axon 20, similar to the illustrative system depicted in FIG. 3.

Figure 6:
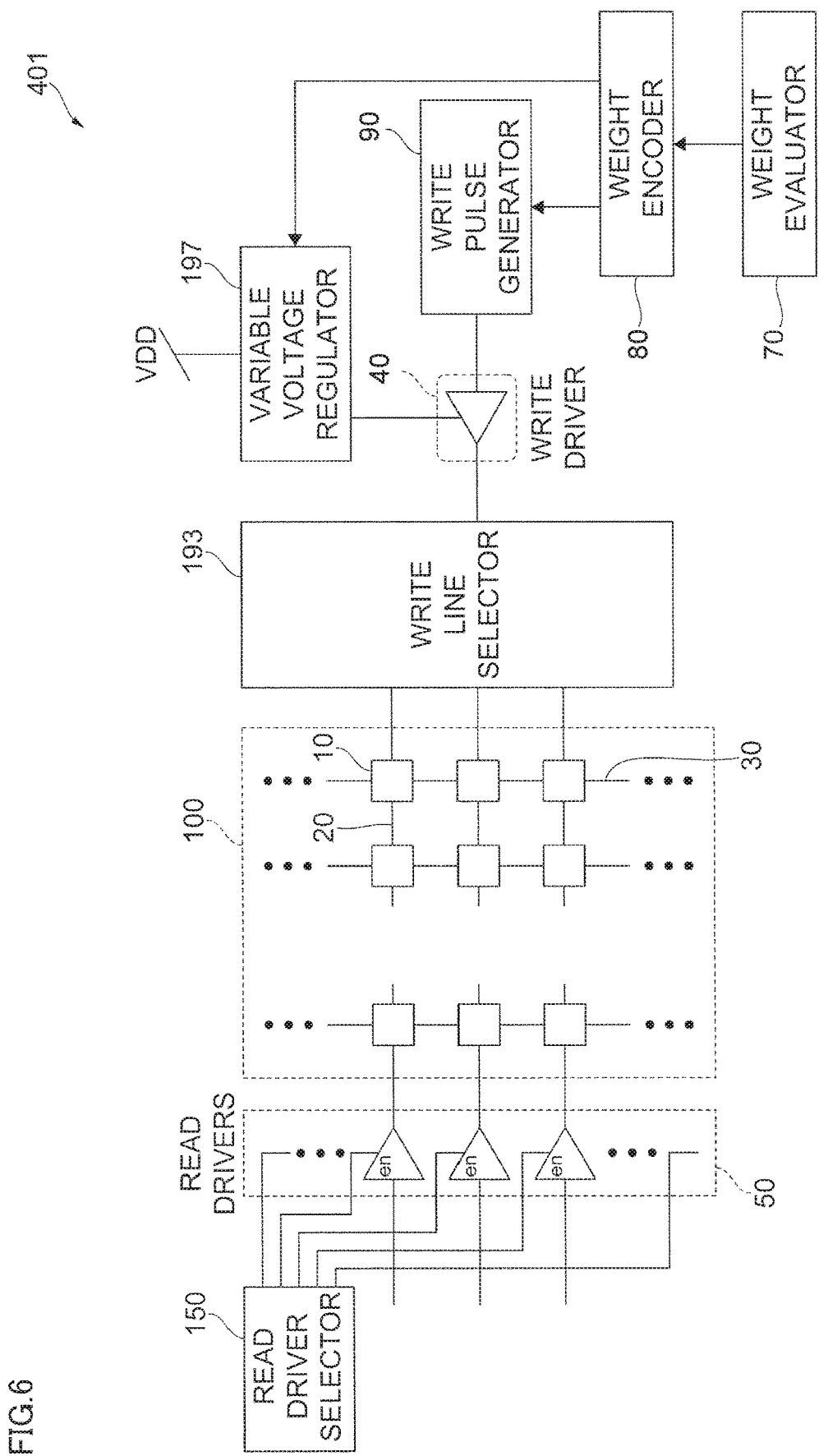
FIG. 6 depicts a synapse memory cell system according to an embodiment of the present invention.

FIG. 6 depicts an example of a synapse memory cell system 401 according to an exemplary embodiment. In FIG. 6, the same structures as those explained with reference to FIGS. 2 and 4 are denoted by the same reference numerals, and the detailed explanation thereof will be omitted.

As shown in FIG. 6, the synapse memory cell system 401 may include the write driver 40, the write line selector 193, and a variable voltage regulator 197 controlling the driving voltage of the write driver 40. This enables the weight encoder 80 to control the driving voltage of the write driver 40. The write driver 40 applies the voltage to the respective axons 20 according to the driving voltage applied by the variable voltage regulator 197. The variable voltage regulator 197 changes (e.g., tunes) the power voltage applied to the write driver 40 under control of the weight encoder 80. By changing the power voltage applied to the write driver 40, the output voltage of the write driver 40 can be controlled. This allows the synapse memory cell 10 to store the synapse weight value at a desired value.

Although the illustrative system depicted in FIG. 6 is shown utilizing the write line selector 193 to switch the axons 20, similar to the illustrative system depicted in FIG. 4, a set of the write driver 40 and the variable voltage regulator 197 can be provided on every axon 20, similar to the illustrative system depicted in FIG. 3.

Figure 7:
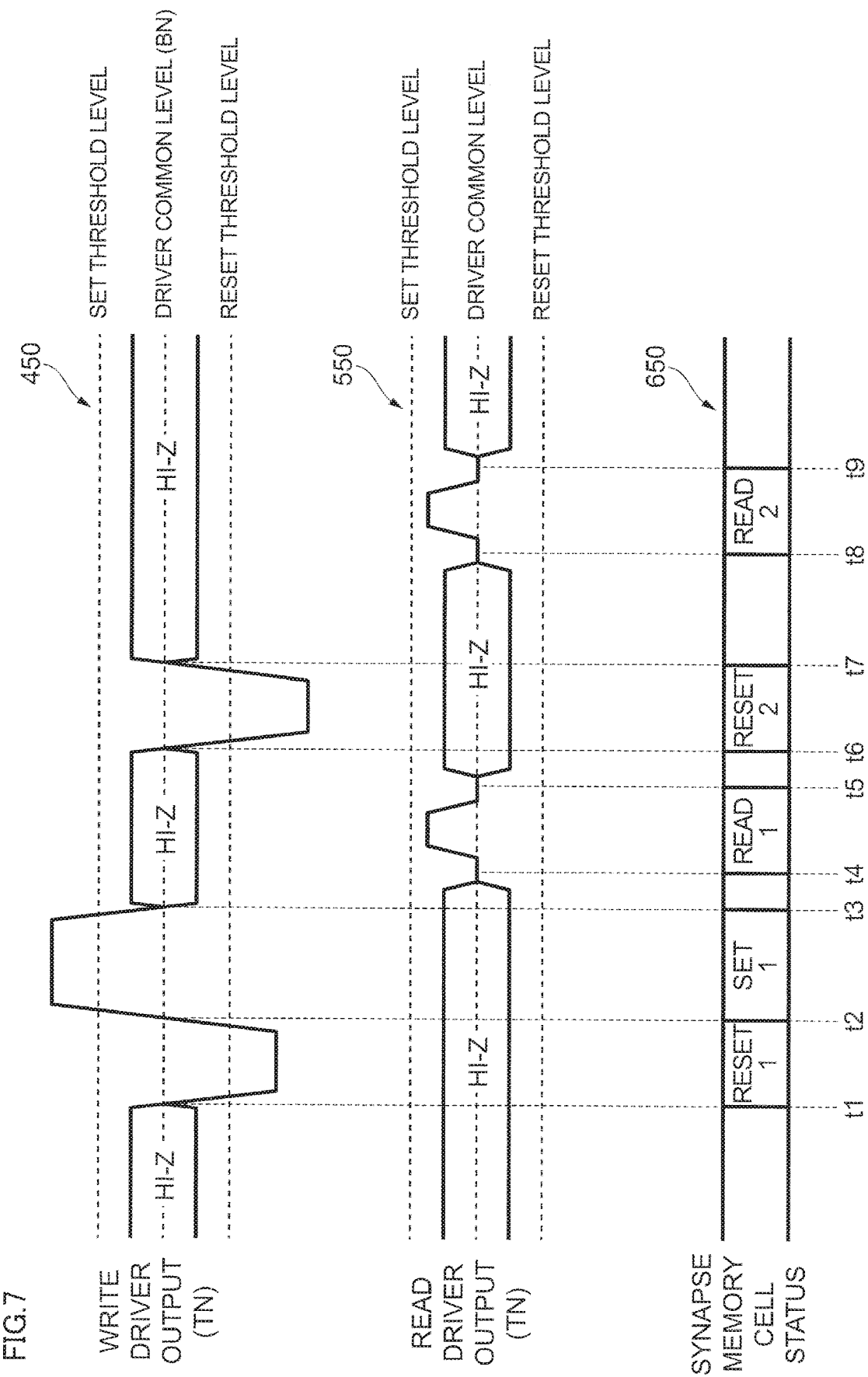
FIG. 7 depicts time charts of the operation of an exemplary synapse memory cell system.

FIG. 7 depicts time charts 450, 550, and 650 of the exemplary synapse memory cell system 101 shown in FIG. 3. The time chart 450 indicates timings of signal outputs from the write driver 140. The time chart 550 indicates timings of signal outputs from the read drivers 50. Further, the time chart 650 indicates timings of state transitions of the synapse memory cell 10.

Referring to FIG. 7, the operation of the synapse memory cell system 101 of FIG. 3 will be explained. However, the explanation is applicable to the operation of other synapse memory cell systems, such as the synapse memory cell systems 201, 301, and 401 respectively shown in FIGS. 4, 5, and 6.

From time t1 to time t2 (period t1-t2), the write driver 140 applies the voltage lower than the reset threshold level to the one of the synapse memory cells 10 (target cell) so that the write driver 140 sets the target cell to a reset state (a certain decremented value). That is to say, a write operation to decrease the synapse weight value is performed. The amount of the decrease of the synapse weight value depends on an amount by which the voltage applied by the write driver 140 falls below the reset threshold level. In the time chart 450, this operation is performed at a state "Reset1" of the time chart 650.

From time t2 to time t3 (period t2-t3), the write driver 140 applies the voltage higher than the set threshold level to the target cell so that the write driver 140 sets the target cell to a set state (a certain incremented value). That is to say, a write operation to increase the synapse weight value is performed. The amount of the increase of the synapse weight value depends on an amount by which the voltage applied by the write driver 140 exceeds the set threshold level. In the time chart 450, this operation is performed at a state "Set1" of the time chart 650.

From time t4 to time t5 (period t4-t5), the read drivers 50 apply a voltage between the driver common level and the set threshold level to the target cell so that the read drivers 50 set the target cell to a read state. That is to say, a read operation of the synapse weight value is performed. If the target cell read in this state is the same one that was written in the "Set1" state, the value to be read at this point corresponds to the synapse weight value updated at the above step (2). In the time chart 550, this operation is performed at a state "Read1" of the time chart 650.

From time t6 to time t7 (period t6-t7), the write driver 140 applies a voltage lower than the reset threshold level to the target cell so that the write driver 140 sets the target cell to another reset state (to another decremented value). That is to say, a write operation to decrease the synapse weight value is performed. In the time chart 450, this operation is performed at a state "Reset2" of the time chart 650.

From time t8 to time t9 (period t8-t9), the read drivers 50 apply a voltage between the driver common level and the set threshold level to the target cell so that the read drivers 50 set the target cell to another read state. That is to say, a read operation of the synapse weight value is performed. If the target cell read in this state is the same one that was written in the "Reset2" state, the value to be read at this point corresponds to the synapse weight value updated from time t6 to time t7. In the time chart 550, this operation is performed at a state "Read2" of the time chart 650.

In periods other than the periods t1-t2, t2-t3, t4-t5, t6-t7 and t8-t9, the target cell is set to the Hi-Z state against the write driver 140 or the read drivers 50. Accordingly, a write operation or a read operation is not performed in these periods.

Here, the respective outputs of the write driver 140 in the periods t1-t2, t2-t3, and t6-t7 have different values. For example, gaps between the respective outputs and the set threshold level (or the reset threshold level) are different from one another. This enables the write driver 140 to write the different values (update the different amount) in the write operation. For example, in FIG. 3 and FIG. 4, outputting the different values from the write driver 140 represents a selection of different write driver bodies 141 in the respective periods. Further, in FIG. 5, outputting the different values represents a selection of different power sources from the multiple power sources VDD1 to VDD~ in the respective periods. Further, in FIG. 6, outputting the different values represents a supply of different VDDs to the write driver 40 in the respective periods.

Figure 8:
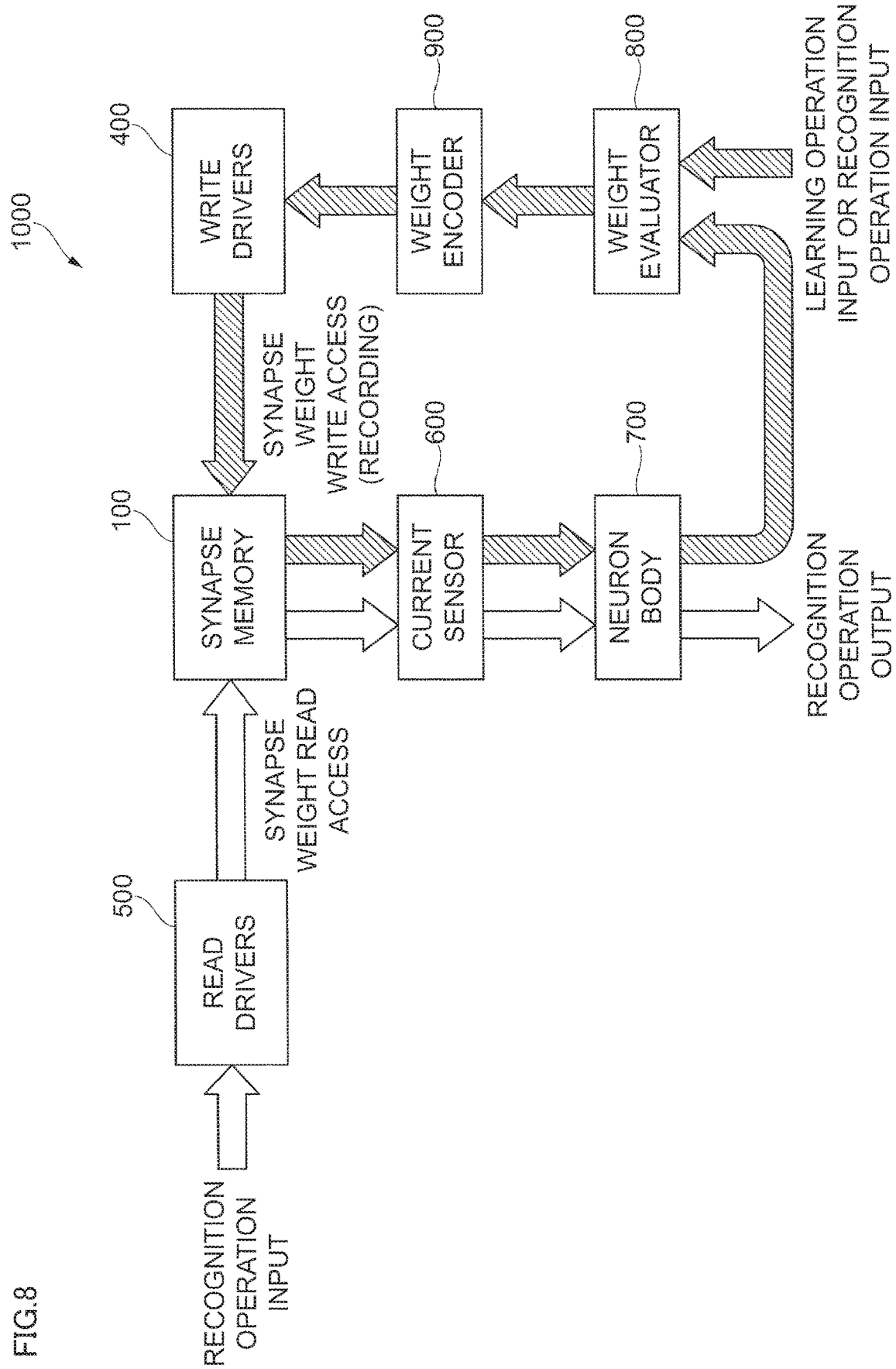
FIG. 8 depicts an example of a neuro-synaptic core system which includes a synapse memory cell system.

FIG. 8 depicts an example of a neuro-synaptic core system 1000 which includes a synapse memory cell system corresponding to the synapse memory cell systems 1, 101, 201, 301, and 401 respectively shown in FIGS. 2 to 6.

Referring to FIG. 8, a data flow in the neuro-synaptic core system 1000 will be explained. In FIG. 8, the synapse memory 100 is assumed to be applied to implement this system with online learning.

As shown in FIG. 8, the neuro-synaptic core system 1000 may include the synapse memory 100, write drivers 400, read drivers 500, a current sensor 600, a neuron body 700, a weight evaluator 800, and a weight encoder 900. For the sake of brevity, an explanation of the write pulse generator 90 shown in FIGS. 2 to 6 will be omitted.

The write drivers 400 may include the write driver structure and the surrounding circuits thereof shown in FIGS. 2 to 6. For example, the write drivers 400 may correspond to the write driver 40 shown in FIG. 2. As another example, the write drivers 400 may correspond to the multiple pairs of the write driver 140 and the write driver selector 191 shown in FIG. 3. As another example, the write drivers 400 may correspond to the write driver 140, the write driver selector 191 and the write line selector 193 shown in FIG. 4. As another example, the write drivers 400 may correspond to the write driver 40, the write line selector 193 and the power selector 195 shown in FIG. 5. As another example, the write drivers 400 may correspond to the write driver 40, the write line selector 193 and the variable voltage regulator 197 shown in FIG. 6.

The read drivers 500 may include multiple read drivers and a read driver selector, such as the read drivers 50 and the read driver selector 150 shown in FIGS. 2 to 6.

The current sensor 600 reads the synapse weight value from the synapse memory cells 10. The current sensor 600 may be connected to the dendrites 30 of the synapse memory 100. The current sensor 600 senses a total current from the dendrites 30 selected by the dendrite driver (not shown) as the subject dendrites. For example, if the read driver voltage is applied to the axon(s) 20 that has been selected by the read driver selector 150, read current passes through the subject dendrites. The magnitude of the current corresponds to the synapse weight values of the synapse memory cells 10 arranged at the cross points of the selected axon(s) and the subject dendrites.

The neuron body 700 performs neuron operations. For example, the neuron body 700 obtains, from the read drivers 50, a product-sum value of the synapse weight value and an input value to the axon. This product-sum value is given as the total current sensed by the current sensor 600. The total current sensed by the current sensor 600 may represent total sum of the product of the input value and the corresponding synapse weight values stored in the synapse memory cells 10 on the cross points of the selected axon(s) and the subject dendrites. Then, the neuron body 700 outputs the neuron output value corresponding to the total product-sum value of the synapse weight value and the input value to the axon.

FIG. 8 further shows a data flow in a learning operation mode indicated by hatched arrows and a data flow in a recognition operation mode indicated by outlined arrows.

In the learning operation mode, as shown in FIG. 8, the write drivers 400 apply a voltage to a corresponding synapse memory cell 10 in the synapse memory 100 in response to a learning operation input or a recognition operation input.

The current sensor 600 senses a total current from the subject dendrite(s) 30 coupled to the synapse memory cell 10. The neuron body 700 calculates a neuron membrane potential value based on the total current sensed by the current sensor 600, and supplies a neuron output to the weight evaluator 800. The weight evaluator 800 compares the neuron output obtained from the neuron body 700 with a learning operation input, and calculates the next synapse weight value which is used to update the contents of synapse memory cell 10, based on a result of the comparison. The weight encoder 900 encodes the next synapse weight value into binary encoded values, and drives the write drivers 400 so that the write drivers 400 can write the binary encoded values to the synapse memory cell 10. The write drivers 400 drive the binary encoded values to the synapse memory cell 10 as the synapse weight value.

In the recognition operation mode, as shown in FIG. 8, the read drivers 500 apply a current to the axons 20 coupled to the synapse memory cells 10 in the synapse memory 100 in response to a recognition operation input.

The current sensor 600 senses a total current from the dendrites 30 coupled to the synapse memory cells 10. The neuron body 700 calculates neuron membrane potential based on the total current sensed by the current sensor 600, and supplies a neuron output to another synapse memory system as a recognition operation output.

Figure 9:
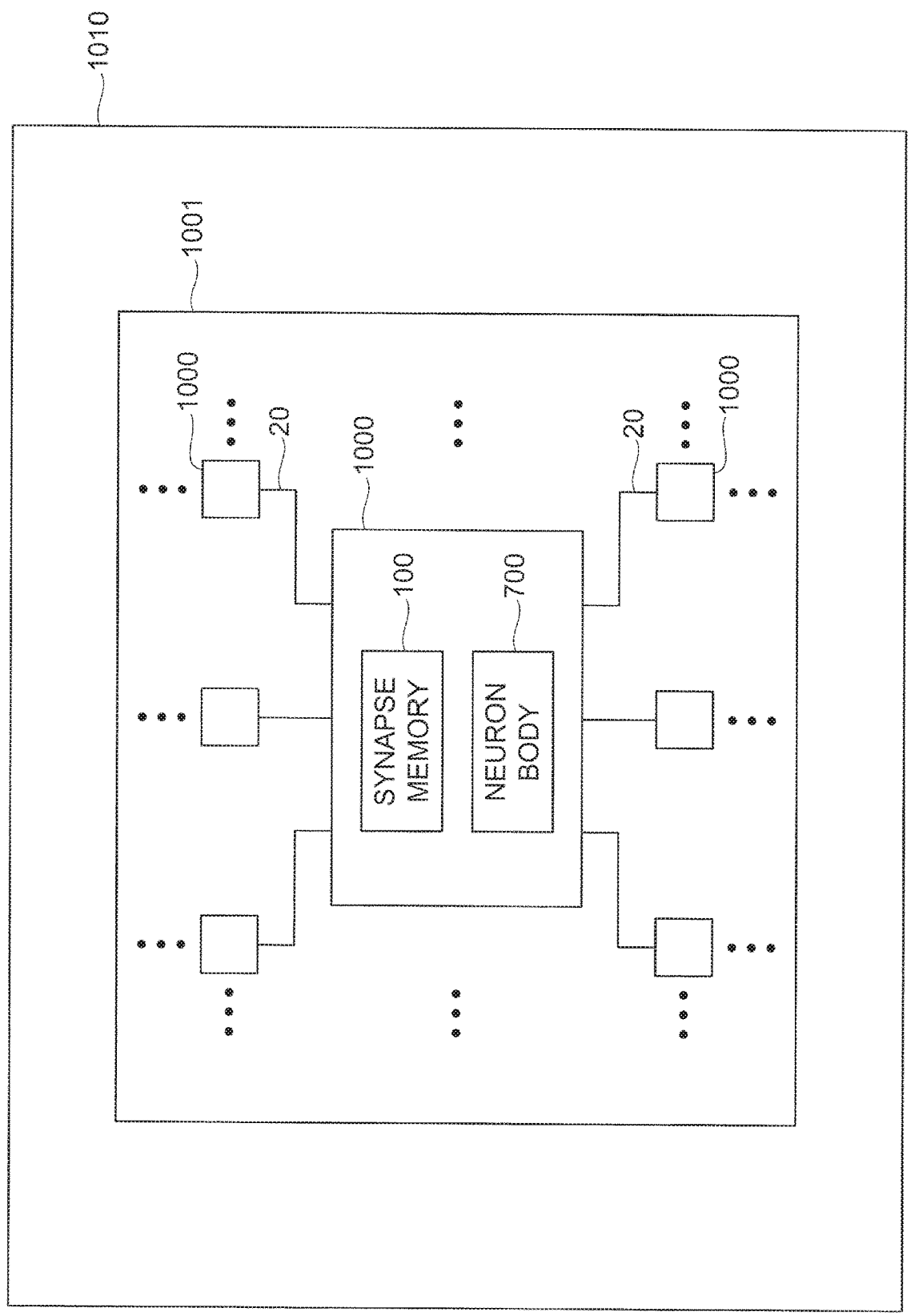
FIG. 9 depicts an example of a computer which includes a neuro-synaptic core system.

FIG. 9 depicts an example of a device 1010 which includes the neuro-synaptic core system 1000.

Referring to FIG. 9, the device 1010 includes the neuro-synaptic core system 1000 shown in FIG. 8. For the sake of brevity, components of the neuro-synaptic core system 1000 other than the write drivers 400 and the neuron body 700 are omitted in FIG. 9.

As shown in FIG. 9, the neuro-synaptic core system 1000 may be provided on the device 1010, such as a computer. In the shown example, multiple neuro-synaptic core systems 1000 are provided on a chip 1001, such as a semiconductor chip. The chip 1001 is then mounted on the device 1010.

Here, the neuro-synaptic core systems 1000 are connected to each other via the axons 20. Each of the neuro-synaptic core systems 1000 includes the synapse memory 100 and the neuron body 700. The synapse memory 100 is connected to a pre-neuron via the axon 20. The neuron body 700 is the body of a post-neuron and its output is used as system output or connected to the synapse memory 100 in the same or other neuro-synaptic core system 1000 via the axon 20. The synapse memory 100 receives an output signal from the pre-neuron (described as post-neuron in the above sentence) to read out the synapse weight value. The neuron body 700 of the post-neuron outputs the output signal to the next neuro-synaptic core system 1000.

Next, an alternative exemplary embodiment will be described. In the above exemplary embodiment, the write operation on the synapse memory cell 10 is conducted by changing the voltage value. Here, instead of the voltage value, the current value may be used for controlling the write operation on the synapse memory cell 10 if the characteristic of the NVRAM permits.

For example, the synapse memory cell system 1 shown in FIG. 2 may be configured to use a driving current instead of VDD, and the driving current may be applied to the write driver 40. The write driver 40 may be configured to control a current to be applied to the respective synapse memory cells 10. This differs from the above configuration of the exemplary embodiment, which controls the voltage to be applied to the respective synapse memory cells 10. The weight encoder 80 may encode the synapse weight value calculated by the weight evaluator 70 into binary encoded values. The weight encoder 80 may control the driving current of the write driver 40 based on the synapse weight value calculated by the weight evaluator 70. This enables the write driver 40 to control the current to be applied to the synapse memory cells 10. The other structures may be the same as those of the above exemplary embodiment.

The operation of the write driver 40 according to the alternate exemplary embodiment is similar to that of the above exemplary embodiment. Here, "driver common level", "set threshold level", and "reset threshold level" can be set for an output current of the write driver 40. The driver common level corresponds to zero current when the write driver 40 is in an off state. The set threshold level is a current level in one (positive) direction at which the write operation to increase the synapse weight value is executable. The reset threshold level is a current level in the opposite (negative) direction at which the write operation to decrease the synapse weight value is executable. Similar to the above exemplary embodiment, when the current applied by the write driver 40 exceeds the set threshold level in the positive direction, the synapse weight value is updated to be increased. When the current applied by the write driver 40 exceeds the reset threshold level in the negative direction, the synapse weight value is updated to be decreased. Controlling the current applied by the write driver 40 enables to control the increment or the decrement amount of the synapse weight value.

Next, examples of the write driver structure and the surrounding circuits thereof according to the alternative exemplary embodiment will be described. For example, multiple pairs of the write driver 140 and the write driver selector 191 (and also write line selector 193 if required) can be provided on the respective axons 20 to control the current to be applied to the synapse memory cells 10, similarly to the write driver structure and the surrounding circuits shown in FIG. 3 (or Fla 4). As another example, the write driver 40, a current selector (not shown) controlling the driving current of the write driver 40 can be provided, similarly to the write driver structure and the surrounding circuits shown in FIG. 5. As yet another example, the write driver 40, a variable current regulator (not shown) controlling the driving current of the write driver 40 can be provided, similarly to the write driver structure and the surrounding circuits shown in FIG. 6. In these examples, the output current of the write driver 140 or 40 can be controlled by adjusting the current to be applied to the write driver 140 or 40. This allows the synapse memory cell 10 to store the synapse weight value at a desired value.

Note that the number of sets of the write driver structure and the surrounding circuits thereof can be equal to or less than the number of the axons 20. This structure may include the write line selector 193 to select the subject axon 20.

Controlling the current with the multiple write drivers 40 for the write operation of the synapse weight value enables to apply a combined current to the synapse memory cell 10. The combined current can be obtained by combining the output currents of the respective drivers 40. Here, an example of the combined current will be described. The example assumes that the synapse memory cell system includes a first write driver WD1 outputting a unitary current at a predetermined current value (a current unit), a second write driver WD2 outputting a current twice as large as the unitary current, and a third driver WD3 outputting a current four times as large as the unitary current. In this example, the write drivers (the first write driver WD1, the second write driver WD2, and the third write driver WD3) can output the current at eight (8) different current values that are different from each other by one (1) current unit. For example, an output current at zero (0) current units can be obtained by selecting no write driver. An output current at one (1) current unit can be obtained by selecting the first write driver WD1. An output current at two (2) current units can be obtained by electing the second write driver WD2. An output current unit at three (3) current units can be obtained by selecting the first write driver WD1 and the second write driver WD2. An output current unit at four (4) current units can be obtained by selecting the third write driver WD3. An output current unit at five (4) current units can be obtained by selecting the first write driver WD1 and the third write driver WD3. An output current unit at six (6) current units can be obtained by selecting the second write driver WD2 and the third write driver WD3. An output current unit at seven (7) current units can be obtained by selecting the first write driver WD 1, second write driver WD2, and the third write driver WD3. Thus, the output current is varied based on the selection of the write drivers.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A synapse memory system comprising:
   a plurality of synapse memory cells provided at cross points of a plurality of axon lines and a plurality of dendrite lines, each synapse memory cell being associated with nonvolatile random-access memory (NVRAM), each synapse memory cell, implemented by hardware, being configured to store a weight value according to an output level of a write signal, and the weight value to be stored in each synapse memory cell being one value of at least three different non-digital values;
   a write portion, implemented by circuitry, configured to write the weight value to each synapse memory cell, the write portion comprising a write driver and an output controller, the write driver being a digital driver, implemented by circuitry, configured to output the write signal to a subject synapse memory cell, the subject synapse memory cell being one of the synapse memory cells, the subject synapse memory cell being selected to store the weight value, and the output controller, implemented by circuitry, being configured to control the output level of the write signal of the write driver; and
   read drivers, implemented by circuitry, configured to read the weight value stored in the synapse memory cells in an analog manner, the read drivers being analog drivers forming a hybrid access system with the digital write driver adaptable for comparatively low-power and high-speed operations to avoid effects from temperature or supply voltage variations.

2. The synapse memory system according to claim 1, wherein:
each synapse memory cell, implemented by hardware, is configured to store the weight value in accordance with a voltage of the write signal; and
the output controller, implemented by circuitry, is configured to control the voltage of the write signal of the write driver.

3. The synapse memory system according to claim 2, wherein:
the write driver comprises a plurality of write driver bodies, each of the write driver bodies outputting the write signal having a different voltage; and
the output controller, implemented by circuitry, is configured to select one of the write driver bodies in accordance with the weight value to be stored in the subject synapse memory cell.

4. The synapse memory system according to claim 2, wherein:
the write driver, implemented by circuitry, is configured to output the write signal having a voltage corresponding to a power supply voltage supplied to the write driver; and
the output controller, implemented by circuitry, is configured to be coupled to a plurality of power sources having different voltages, the output controller selecting one of the power sources to supply the voltage to the subject synapse memory cell in accordance with the weight value to be stored in the subject synapse memory cell.

5. The synapse memory system according to claim 2, wherein:
the write driver is a single write driver, implemented by circuitry, configured to output the write signal having a voltage corresponding to a power supply voltage supplied to the write driver; and
the output controller, implemented by circuitry, is configured to control the a voltage level of the power supply voltage supplied to the write driver.

6. The synapse memory system according to claim 1, wherein:
each synapse memory cell, implemented by hardware, is configured to store the weight value in accordance with a current of the write signal; and
the output controller, implemented by circuitry, is configured to control the current of the write signal of the write driver.

7. The synapse memory system according to claim 1, wherein the write portion comprises a plurality of write portions respectively provided on the axon lines.

8. The synapse memory system according to claim 1, further comprising a write line selector, implemented by circuitry, configured to select one of the axon lines, wherein:
the write portion is provided for at least two lines of the axon lines; and
the write portion writes the weight value to the subject synapse memory cell via the one of the axon lines selected by the write line selector, the subject synapse memory cell being provided on the one of the axon lines.

9. A device comprising a synapse memory system, the synapse memory comprising:
a plurality of synapse memory cells provided at cross points of a plurality of axon lines and a plurality of dendrite lines, each synapse memory cell being associated with nonvolatile random-access memory (NVRAM), each synapse memory cell, implemented by hardware, being configured to store a weight value according to an output level of a write signal, and the weight value to be stored in each synapse memory cell being one value of at least three different values;
a write portion, implemented by circuitry, configured to write the weight value to each synapse memory cell, the write portion comprising two or more write drivers and an output controller, the write drivers being digital drivers, implemented by circuitry, configured to output the write signal to a subject synapse memory cell with each of the write drivers using a different driving current, the subject synapse memory cell being one of the synapse memory cells, the subject synapse memory cell being selected to store the weight value, and the output controller, implemented by circuitry, being configured to control the output level of the write signal of the write driver; and
read drivers, implemented by circuitry, configured to read the weight value stored in the synapse memory cells in an analog manner, the read drivers being analog drivers forming a hybrid access system with the digital write driver adaptable for comparatively low-power and high-speed operations to avoid effects from temperature or supply voltage variations.

10. The device according to claim 9, wherein:
each synapse memory cell, implemented by hardware, is configured to store the weight value in accordance with a voltage of the write signal; and
the output controller, implemented by circuitry, is configured to control the voltage of the write signal of the write driver.

11. The device according to claim 10, wherein:
the write driver comprises a plurality of write driver bodies, each of the write driver bodies outputting the write signal having a different voltage; and
the output controller, implemented by circuitry, is configured to select one of the write driver bodies in accordance with the weight value to be stored in the subject synapse memory cell.

12. The device according to claim 10, wherein:
the write driver, implemented by circuitry, is configured to output the write signal having a voltage corresponding to a power supply voltage supplied to the write driver; and
the output controller, implemented by circuitry, is configured to be coupled to a plurality of power sources having different voltages, the output controller selecting one of the power sources to supply the voltage to the subject synapse memory cell in accordance with the weight value to be stored in the subject synapse memory cell.

13. The device according to claim 10, wherein:
the write driver is a single write driver, implemented by circuitry, configured to output the write signal having a voltage corresponding to a power supply voltage supplied to the write driver; and
the output controller, implemented by circuitry, is configured to control the voltage level of the power supply voltage supplied to the write driver.

14. The device according to claim 9, wherein:
each synapse memory cell, implemented by hardware, is configured to store the weight value in accordance with a current of the write signal; and the output controller, implemented by circuitry, is configured to control the current of the write signal of the write driver.

15. The device according to claim 9, wherein the write portion comprises a plurality of write portions respectively provided on the axon lines.

16. The device according to claim 9, further comprising a write line selector, implemented by circuitry, configured to select one of the axon lines, wherein:
   the write portion is provided for at least two lines of the axon lines; and
   the write portion writes the weight value to the subject synapse memory cell via the one of the axon lines selected by the write line selector, the subject synapse memory cell being provided on the one of the axon lines.

* * * * *